United States Patent [19]
Swan

[11] Patent Number: 5,854,576
[45] Date of Patent: Dec. 29, 1998

[54] METHOD AND APPARATUS FOR A FINELY ADJUSTABLE CLOCK CIRCUIT

[75] Inventor: Philip Lawrence Swan, Toronto, Canada

[73] Assignee: ATI Technologies, Canada

[21] Appl. No.: 840,399

[22] Filed: Apr. 29, 1997

Related U.S. Application Data

[63] Continuation-in-part of Ser. No. 840,568, Apr. 21, 1997.
[51] Int. Cl.[6] .................................................... H03B 27/00
[52] U.S. Cl. .............................. 331/57; 331/1 A; 331/45; 331/46; 331/49; 331/74; 377/47; 327/156; 327/160; 375/371; 375/376; 345/213
[58] Field of Search ..................................... 327/160, 150, 327/151, 152, 156, 161, 113; 377/47; 331/1 A, 20, 57, 45, 46, 49, 74; 375/371, 376; 345/213

[56] References Cited

U.S. PATENT DOCUMENTS

| | | | |
|---|---|---|---|
| 5,268,656 | 12/1993 | Muscavage | 331/45 |
| 5,694,066 | 12/1997 | Shyong | 327/160 X |

*Primary Examiner*—Arnold Kinkead
*Attorney, Agent, or Firm*—Markison & Reckamp

[57] ABSTRACT

A method and apparatus for generating a finely adjustable clock is accomplished by a ring oscillator, a plurality of counting circuits, and a controller. The ring oscillator generates a plurality of oscillations, wherein each of the oscillations have an approximately equal period and are phase shifted by an approximately equal phase shift. Each of the plurality of oscillations is provided to one of the counting circuits which divides the frequency of the respective oscillation by a given count value to produce corresponding periodic representation. The controller selects one of the corresponding periodic representations based on control signal to be the output oscillation, or clock signal. When the clock signal needs to be finely adjusted, the controller, based on the control signal, selects another one of the corresponding periodic representations. To achieve a finer adjustment of the output oscillation, the controller, based on the control signal, may select more than one of the corresponding periodic representations. By selecting a different periodic representation, the clock signal is slipped by the phase difference between the oscillations. The slipping should be done in a regular way, (Eg. every CPR cycle) or jitter may be introduced.

20 Claims, 7 Drawing Sheets

METHOD AND APPARATUS FOR A FINELY ADJUSTABLE CLOCK CIRCUIT

This patent application is a continuation in part of co-pending patent application entitled METHOD AND APPARATUS FOR PHASE SHIFTING A CONTROLLED OSCILLATOR AND APPLICATIONS THEREOF, assigned to same assignee as the present patent application and having Ser. No. 08/840,568, filed Apr. 21, 1997.

TECHNICAL FIELD OF THE INVENTION

This invention relates generally to phase locked loops and more particularly to a method and apparatus for generating a finely adjustable clock signal for use in phase locked loops.

BACKGROUND OF THE INVENTION

It would be an understatement to say that computers have changed our society. Computers have made it possible to communicate data around the world in seconds, have access to more information than any one person could assimilate in ten life times, and countless other advantages. And, advances in computer technology are occurring every day. For example, video image processing is making dramatic advances in picture quality for all types of image sources such as multimedia imaging, video conferencing, video games, VCR (video cassette recorder), broadcast television, cable television, and DVD (digital video disks), to name just a few.

Displaying video images that were specifically designed to be displayed on a computer display can be done with the utmost of clarity. For example, still images and computer graphical interface images are displayed with great clarity on computer displays where the display rate is 75 Hz, 90 Hz, or 100 Hz. Because of the static nature of these images, the number being prepared for display, or the image update rate, exactly match the display update rate (the number of images the display will present in a second).

Similarly, for television, the incoming images have an image update rate that exactly matches the display update rate of the television. In North America the television display update rate is sixty Hertz and in Europe the television display update is fifty Hertz.

A difficulty arises when displaying images that were not specifically designed to be displayed on a computer display, such as images from television broadcasts, VCRs, DVDs, and cable television broadcasts. These video transmission mediums have their own image update rates. For example, North American television has an image update rate of 59.94 Hz, while European television has an image update rate of 50 Hz, and motion pictures have an image update rate of 24 Hz. Due to the differences between the image update rate of these video image mediums and the display update rate of the computer display, update rate compensation is needed.

One update rate compensation technique is to drop or repeat an image when the timing between the image update rate and the display update rate is offset by an image (i.e., becomes a frame out of sync). When the image update rate is faster than the display update rate, images need to be dropped (i.e., not shown). While this keeps the image update rate in sync with the display update rate, the dropping of the images may be noticeable For example, if the image that is dropped in one in a series of action images (an object is moving), there may be a noticeable jump in the movement of the object because of the dropped image. When the image update rate is slower than the display update rate, images need to be repeated to keep the update rates in sync. The repeated image may produce a noticeable jump for objects in motion, similar to the dropped image. Thus, this technique works well for still image projection, but for movies, sporting events, and other television broadcasts, it is not desirable because of the noticeable jumps.

Another update rate compensation technique is to reset the display update rate to equal the image update rate. While this overcomes the above mentioned difficulty, it creates a new one. When the display update rate is adjusted for some display devices during a mode change, the screen blanks for a few seconds to reset the display update rate. If the display update rate needs to be changed to initiate video, the blanking of the screen can be quite annoying to the user.

Therefore, a need exists for a method and apparatus that adjusts the display update rate without the adverse effects mentioned above and does so in a visually acceptable manner.

DETAILED DESCRIPTION OF THE DRAWINGS

Generally, the present invention provides a method and apparatus for generating a finely adjustable clock. This may be accomplished by a ring oscillator, a plurality of counting circuits, and a controller. The ring oscillator generates a plurality of oscillations, wherein each of the oscillations have an approximately equal period and are phase shifted by an approximately equal phase shift. Each of the plurality of oscillations is provided to one of the counting circuits which divides the frequency of the respective oscillation by a given count value to produce a corresponding periodic representation. The controller selects one of the corresponding periodic representations based on a control signal to be the output oscillation, or clock signal. To achieve a finer adjustment of the output oscillation, the controller, based on the control signal, may select more than one of the corresponding periodic representations. By selecting a different periodic representation, the clock signal is slipped by the phase difference between the oscillations. The slipping should be done in a regular way, (Eg. every CPR cycle) or jitter may be introduced. With such a method and apparatus, the present invention provides a finely adjustable clock circuit that may be used in a phase locked loop which, in turn, is used in a video graphic circuit. By finely adjusting the phase locked loop, the display update rate may be changed, over time, to substantially match the image update rate without adverse visual effects.

Figure 1:
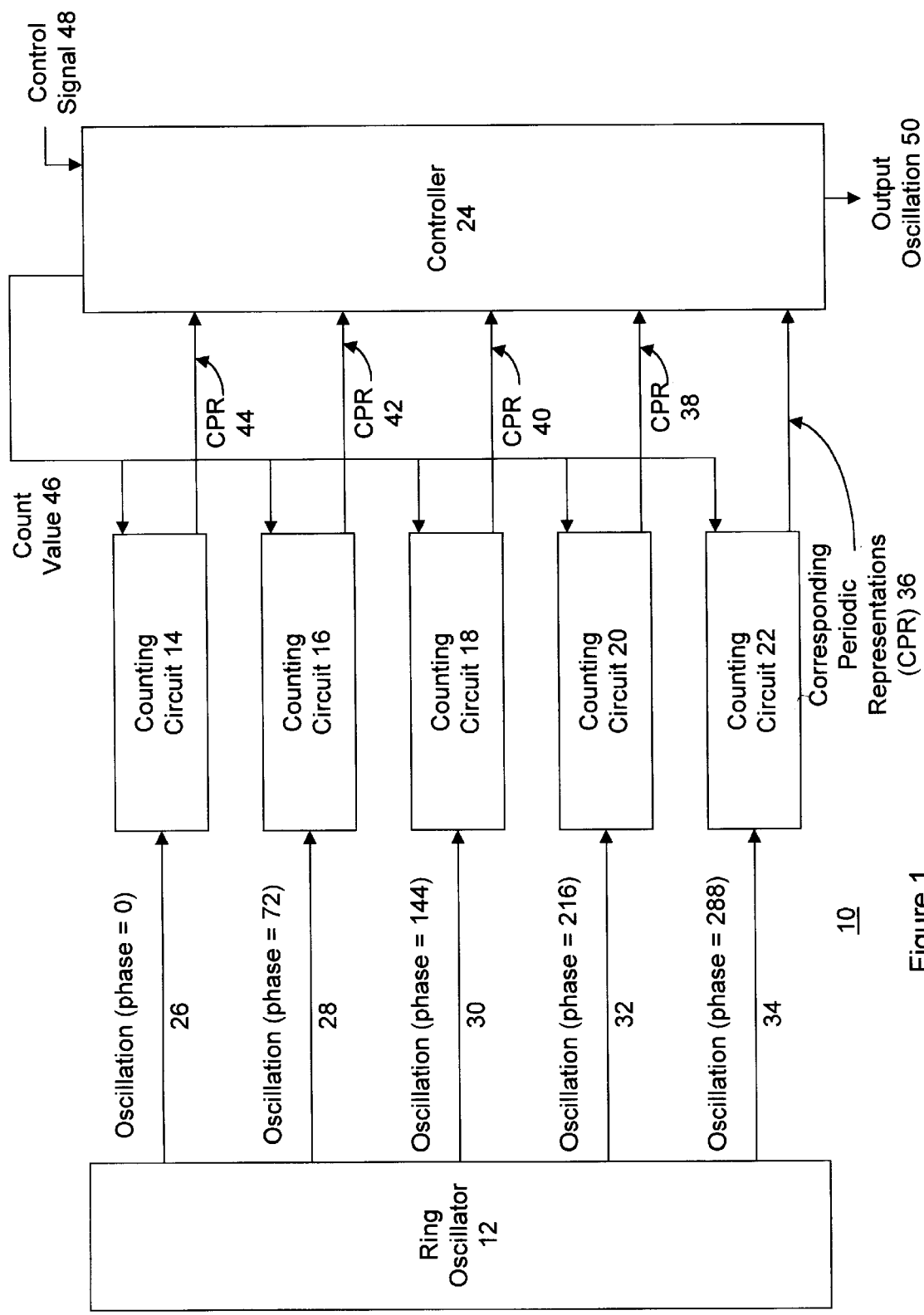
FIG. 1 illustrates a schematic block diagram of a finely adjustable clock which is in accordance with the present invention.

The present invention can be more fully described with reference to FIGS. 1 through 9. FIG. 1 illustrates a schematic block diagram of a finely adjustable clock 10 which includes a ring oscillator 12, a plurality of counting circuits 14–22, and a controller 24. The ring oscillator 12 includes a plurality of cascaded inverters operably coupled to produce a plurality of oscillations 26–34, where the plurality of oscillations 26–34 have approximately the same period and are phase shifted by approximately the same phase offset. The period of the ring generator 12 is dependent upon a frequency control signal and the number of inverters. For example, if the ring generator 12 includes five cascaded inverters, the output frequency could be in the range of 10 MHz to 500 MHz. Each of the five inverters produces one of the plurality of oscillations, where the first inverter produces the first oscillation 26, which has a phase shift of 0 degrees; the third inverter produces the second oscillation 28, which has a phase shift of 72 degrees; the fifth inverter produces the third oscillation 30, which has a phase shift of 144 degrees; the second inverter produces the fourth oscillation 32, which has a phase to shift of 216 degrees; and the fourth inverter produces the fifth oscillation 34, which has a phase shift of 288 degrees.

The plurality of oscillations are provided to the plurality of counting circuits 14–22, which produce a plurality of corresponding period representations 36–44 of the plurality of oscillations. For example, counting circuit 14 receives oscillation 26 and generates the corresponding periodic representation (CPR) 44 by counting the number of cycles of oscillation 26 up to the count value 46. When the number of cycles of oscillation 26 equals the count value 46, the counting circuit 14 produces a pulse; a plurality of these pulses comprises the CPR 44.

The controller 24 receives the plurality of CPRs 36–44 and selects one of them, based on control signal 48, as the output oscillation 50. The control signal 48 is derived by an update rate adjust circuit that regulates a display update rate to substantially match an image update rate over time. Regulation is obtained by finely adjusting the clock rate upon which the display update rate is derived. The adjustment of the clock rate is in the order of one-tenth of one percent to one-one ten thousandths of one percent. When the clock rate needs to be changed, the control signal 48 is interpreted by the controller 24 to select the next oscillation to function as the output oscillation 50. A more detailed lo discussion of oscillation "slippage" will be presented below with reference to FIG. 2.

Figure 2:
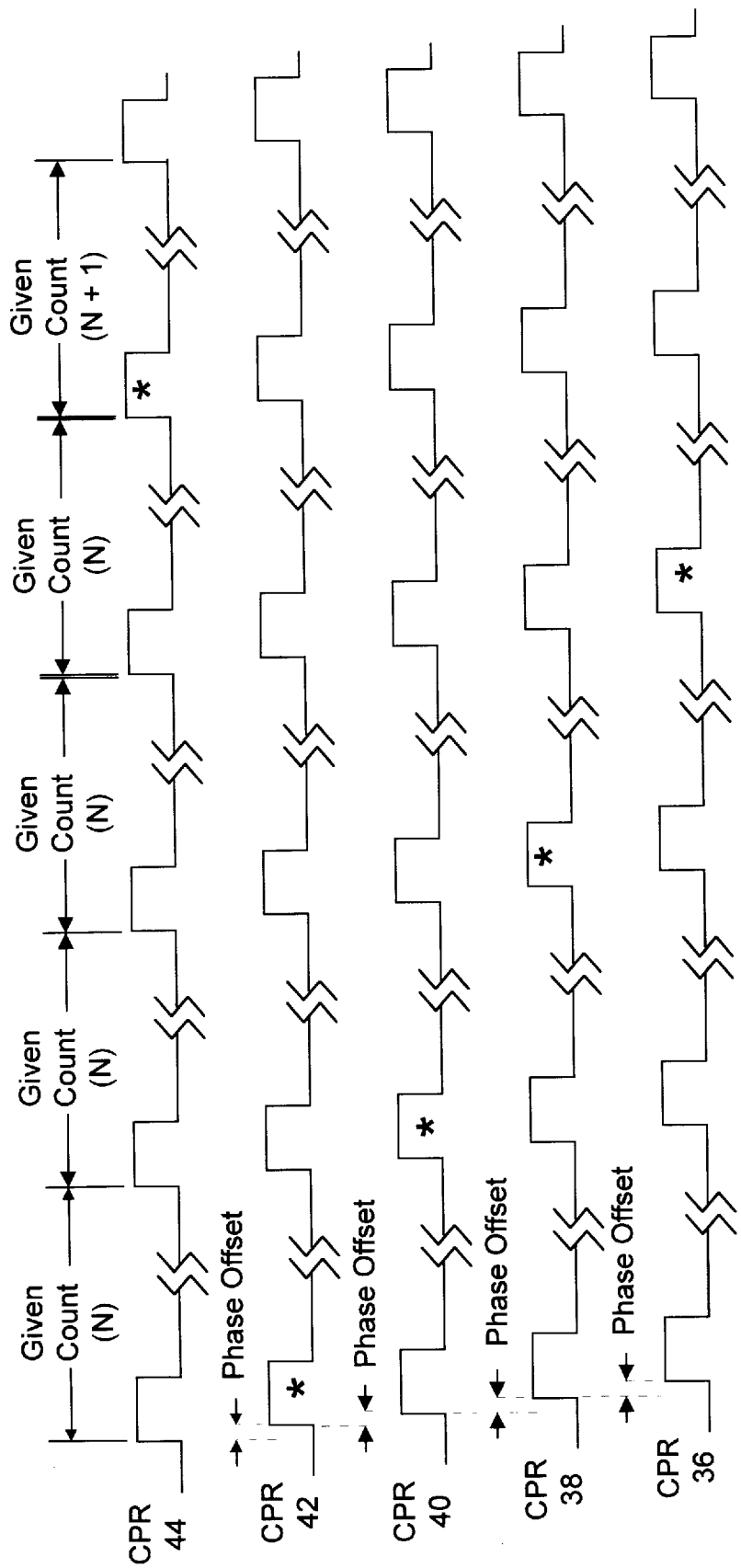
FIG. 2 illustrates a timing diagram of the finely adjustable clock.

FIG. 2 illustrates a timing diagram of the finely adjustable clock 10. As shown, each of the corresponding periodic representations (CPR) 36–44 are shown to be offset by a phase offset of an approximately equal value. For the example shown with five CPRs, the phase offset is 72 degrees. As one skilled in the art will readily appreciate, the phase offset will vary depending on how many oscillations the ring generator creates. For example, the number of oscillations may vary from three to fifteen, where the phase offset would be 120 degrees for the three oscillations and twenty-four degrees for the fifteen oscillations. Each CPR is shown to include a plurality of pulses which are spaced based on the given count value 46. Every so often, the count value (N) is incremented by one (N+1). This occurs when the sum of the phase shifts of the selected oscillations equals or exceeds 360 degrees.

As shown, CPR 42 has an asterisk at its first pulse; this symbolizes which CPR the controller has selected as the output oscillation 50. Having selected this CPR, the output oscillation has "slipped" once, i.e., it has a 72 degree phase shift since it is generated from the second oscillation 28. CPR 42 remains as the output oscillation until the controller selects the next CPR, which is CPR 40, to be the output oscillation 50. While CPR 42 is the output oscillation, the count value remains as N, which could be in the range from two to several thousand. When CPR 40 becomes the output oscillation, the cumulative phase shift is 144 degrees. Over time, CPR 38 and CPR 36 are selected as the output oscillation, as indicated by the asterisk, with the accumulated phase shift being 288 degrees.

At some point in time, the controller 24 will select CPR 44 to be the output oscillation 50. When this occurs, the cumulative phase shift equals 360 degrees. If the given count value N remained the same, the period between the last pulse of CPR 36 and the first pulse of CPR 44 would make up the output frequency and would be greater than the desired period. To correct for this problem, the count value is adjusted by one, whenever the cumulative phase shift equals or exceeds 360 degrees. This can be explained mathematically by: next given count value=N+integer[(J+K)/P], where N is current given count and is an integer, P represents a number of oscillations in the plurality of oscillations, K represents a number of oscillations jumps per given slip and is in a range of 1 to P−1, J represents the currently selected oscillation counting from 0, and next J=(J+K) modulus (P).

Applying the preceding equation to the illustration of FIG. 2, P=5 (number of CPRs), K=1 (the next CPR selected is one phase offset from the current CPR), J increments as the output oscillation slips, i.e., new CPRs are selected as the output oscillation. When the first slip occurred, J=0; the second, J=1; the third, J=2; the fourth, J=3, and the fifth, J=4. When the output oscillation slips for the sixth time, J=0 due to the modulus (P) factor. As such, whenever the output oscillation slips by a multiple of P times, the given count is N+1, but only for one count. As such, once the counting circuits have counted N+1 cycles of the oscillations, the count value returns to N, until the next modulus (P) slippage.

Figure 3:
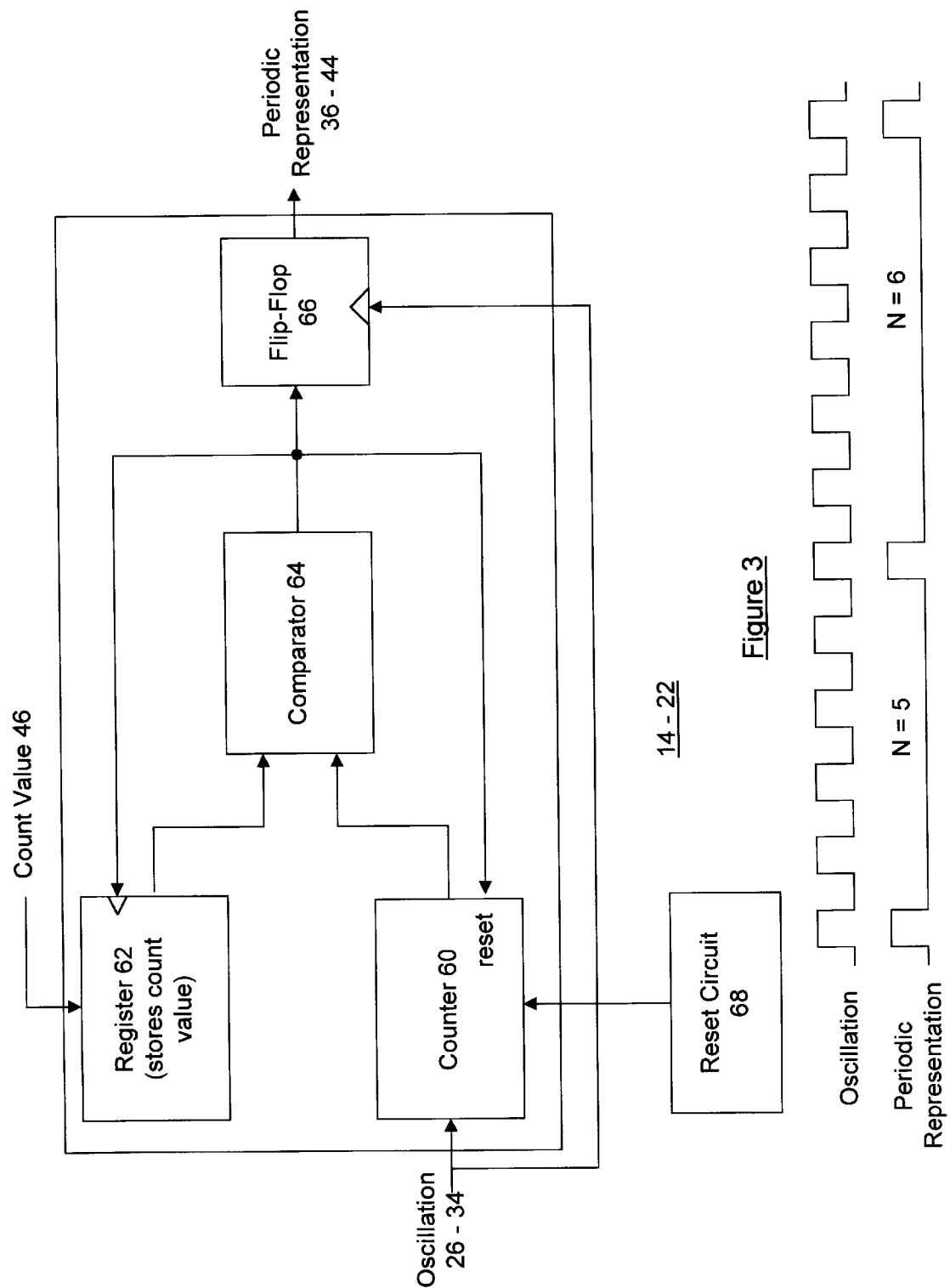
FIG. 3 illustrates a schematic block diagram of a counting circuit of the finely adjustable clock of FIG. 1.

FIG. 3 illustrates a schematic block diagram of a counting circuit 14–22 which includes a counter 60, a register 62, a comparator 64, and an edge shaping circuit, such as a flip-flop 66. The counter 60 is operably coupled to receive the respective oscillation 26–34 and counts the cycle of the respective oscillation 26–34. The counter output is provided to the comparator 64, which compares the counted value produced by the counter with the given count value 46, which is stored in the register 62. When the counted value equals the given count value, the comparator 64 outputs a logic one to the input of the flip-flop 66, which is clocked in at the next leading, or trailing, edge of the respective oscillation 26–34. The flip-flop 66 provides edge shaping of a pulse such that the pulses of the CPRs 36–44 have clean edges and approximately equal pulse widths.

When the counter 60 reaches the count value 46, the counter is reset by the reset circuit 68. The only issue with resetting the counter 60 of the counting circuits 14–22 is to ensure that the CPR which is created from the oscillation having the zero phase shift, remains the CPR with zero phase shift. As such, the reset circuit 68 has a very short window from when the pulse of the last oscillation transitions high to when the next pulse of the first oscillation transitions high to reset the counters 60. If done too early, the last oscillation will not reach the count value before being reset, and if done too late, the first oscillation count will exceed the count value. The timing diagram at the bottom of the figure illustrates a count value 46 of five and a count value of N+1. As one skilled in the art will readily appreciate, there are a variety of ways to generate the a corresponding periodic representations using counting schemes. For example, the count value may be loaded in to the counter and a count down operation could be used, where the comparator looks of a 0 value from the counter.

Figure 4:
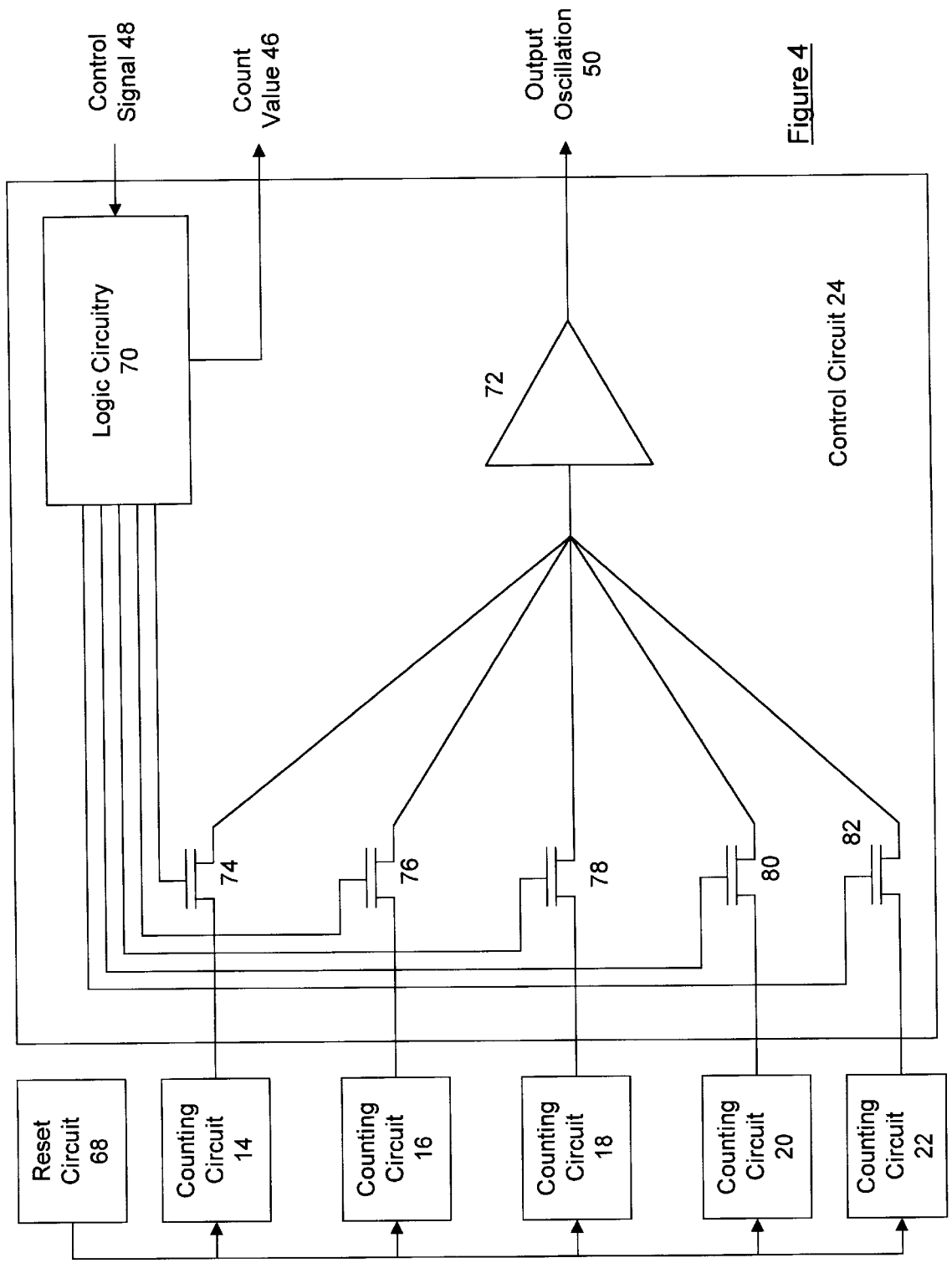
FIG. 4 illustrates a schematic block diagram of a control circuit of the finely adjustable clock of FIG. 1.

FIG. 4 illustrates a schematic block diagram of a control circuit 24 which includes logic circuitry 70, a buffer 72, and a plurality of tri-state devices 74–82. The logic circuitry 70 performs the equation shown in FIG. 2 and selects one of the oscillations based on the control signal 48. Each of the plurality of tri-state devices 74–82 are coupled to one of the plurality of counting circuits 14–22 and to the input of the buffer 72. The coupling between the tri-state devices 74–82 and the buffer 72 needs to be matched such that transmission line effects are approximately equal for each path. As apparent from the figure, when one of the tri-state devices is active, it couples its respective CPR from the counting circuit to the buffer 72, which, in turn, outputs it as the output oscillation 50.

Figure 5:
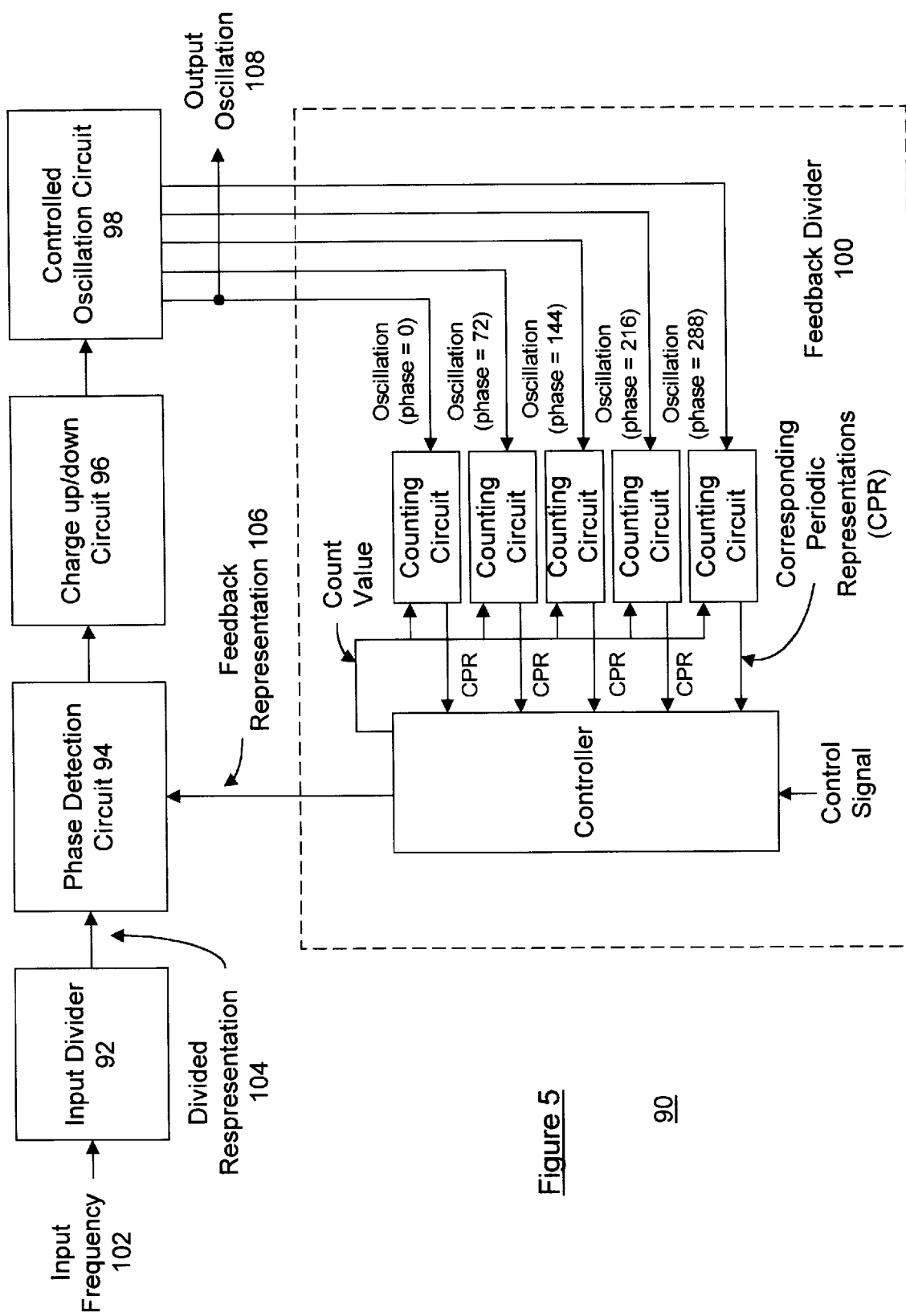
FIG. 5 illustrates a schematic block diagram of a phase locked loop which is in accordance with the present invention.

FIG. 5 illustrates a schematic block diagram of a phase locked loop 90 which includes an input divider 92, a phase detection circuit 94, a charge up/down circuit 96, a controlled oscillation 98, and a feedback divider 100. Such a phase locked loop 90 may be used in a video graphics circuit to provide very small changes to the display update rate such that, over time, the display update rate matches an image update rate.

In operation, the input divider 92 receives an input frequency 102, which may be in the range of 10 MHz to 100 MHz, and produces, therefrom, a divided representation 104 by counting the number of cycles of the input frequency and generating a pulse every M counted cycles. The divided representation 104 is phase compared to a feedback representation 106 by the phase detection circuit 94. The phase detection circuit 94 detects when the feedback representation 106 is leading the divided representation 104 and produces a signal to slow the output oscillation 108 down. Conversely, when the divided representation 104 leads the feedback representation 106, the phase detection circuit 94 generates a signal to speed up the output oscillation 108.

The controlled oscillation circuit 98, based on the signals received by the phase detection circuit 94, via the charge up/down circuit 96, generates a plurality of oscillations via a ring generator. The plurality of oscillations, of which one is selected as the output oscillation 108, is provided to the feedback divider 100. The feedback divider 100 includes the plurality of counting circuits 14–22 and the controller 24. The controller 24 selects one of the CPRs 36–44 as the feedback representation 106. The selection of one of the CPRs 36–44 is as previously discussed.

Figure 6:
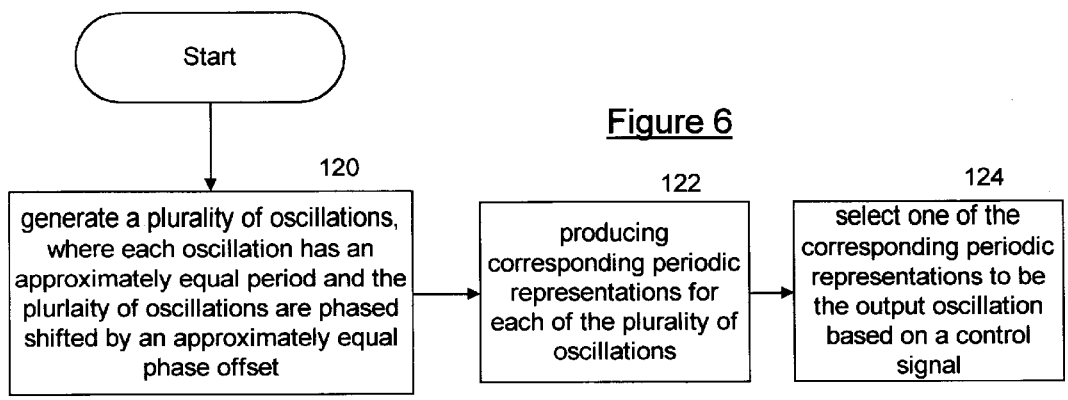
FIG. 6 illustrates a logic diagram that may be used to implement a finely adjustable clock in accordance with the present invention.

FIG. 6 illustrates a logic diagram that may be used to implement a finely adjustable clock. The process begins at step 120 where a plurality of oscillations are generated. Each of the oscillations have an approximately equal period and are phase shifted by an approximately equal phase offset. The process proceeds to step 122, where corresponding periodic representations of the plurality of oscillations are generated. Next, the process proceeds to step 124, where one of the corresponding periodic representations is selected to be the output oscillation based on a control signal. The control signal regulates the display update rate to substantially match, over time, an image update rate.

Figure 7:
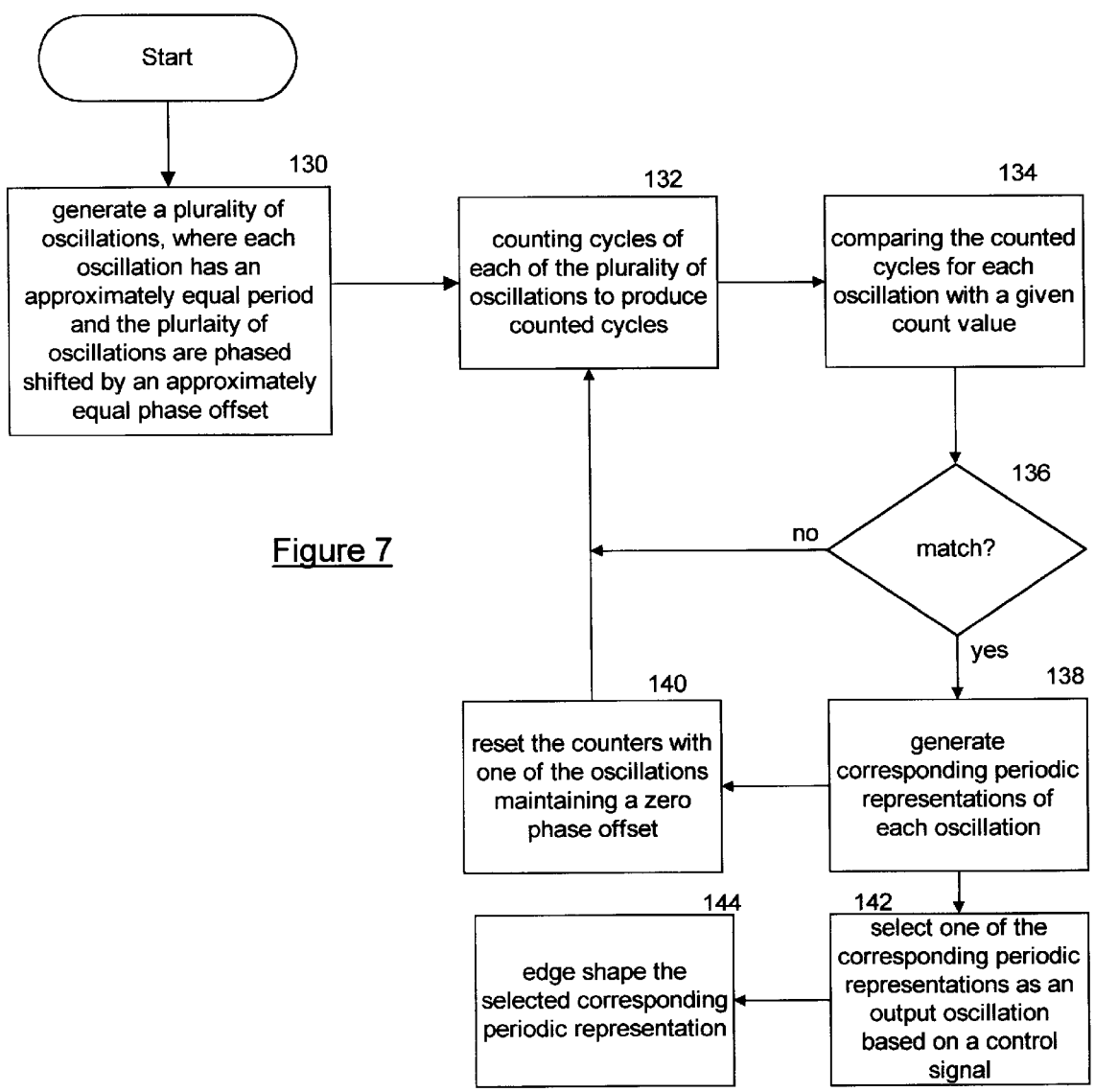
FIG. 7 illustrates a logic diagram that may be used to implement a finely adjustable clock in an alternate manner which is in accordance with the present invention.

FIG. 7 illustrates a logic diagram that may be used to implement a finely adjustable clock in an alternate manner. The process begins at step 130 where a plurality of oscillations are generated. Each of the oscillations have an approximately equal period and are phase shifted by an approximately equal phase offset. The process proceeds to step 132 where cycles of each of the plurality of oscillations are counted to produce counted cycles. The process proceeds to step 134 where the counted cycles for each oscillation is compared to the given count value. If they don't match, as determined at step 136, the process converts back to step 132.

If, however, the counted cycles matches the given count value, the process proceeds to step 138, where corresponding periodic representations are generated from each oscillation. Having done this, the process simultaneously proceeds to step 140 and 142. At step 140, the counters are reset such that one of the oscillations continues to have a zero phase shift. After resetting the counters, the process continues at step 132. At step 142, one of the corresponding periodic representations is selected to be the output oscillation. The process then proceeds to step 144 where the selected corresponding periodic representation is edge shaped.

Figure 8:
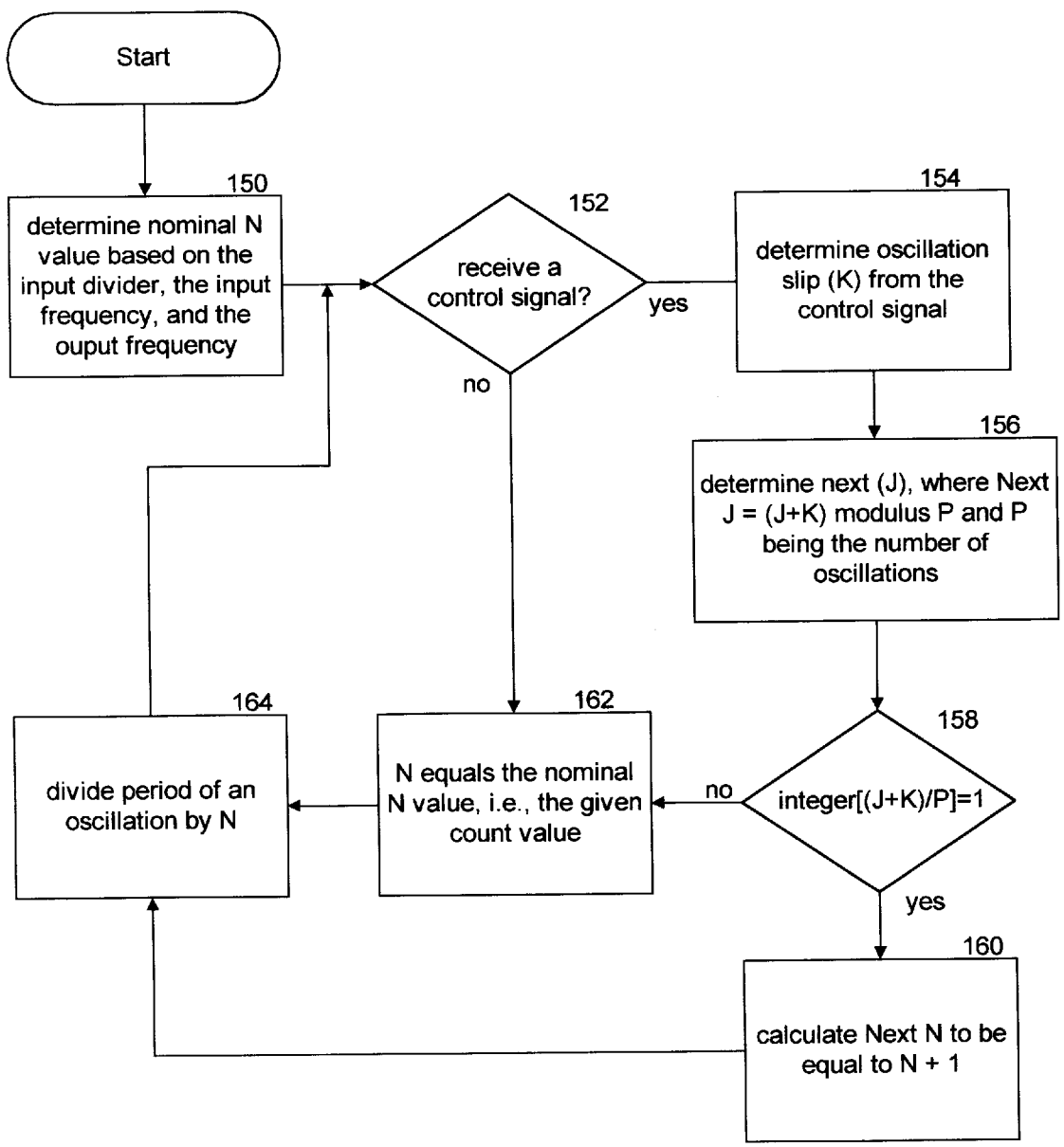
FIG. 8 illustrates a logic diagram that may be used to determine a given count value for the finely adjusted clock in accordance with the present invention.

FIG. 8 illustrates a logic diagram that may be used to determine a given count value for the finely adjusted clock. The process begins at step 150 where a nominal count value N is determined. The given count value will be based on a ratio between the input frequency and the output frequency, and the input divider. For example, if the input frequency is 14 Mz, the input divider is 70 and the desired output frequency is 100 MHz, then N equals 500. Having determined the nominal N value, the process proceeds to step 152 where a determination is made as to whether a control signal has been received, or a change has occurred in the control signal. If not, the process proceeds to step 162 where the next given count value equals the nominal N value. The process then proceeds to step 164 where an oscillation is divided by the nominal N to produce a corresponding periodic representation.

If, however, a control signal has been received, or a change has occurred in the control signal, the process proceeds to step 154 where an oscillation skip value (K) is determined. The process then proceeds to step 156, where the number of shifts is determined to be Next (J)=(J+K) modulus (P), where K is the number of oscillations jumped per slip of the output oscillation and P is the number of oscillations. The process then proceeds to step 158 where a determination is made as to whether the integer portion of (J+K)/P equals one. If not, the process proceeds to step 162. If, however, the integer portion of (J+K)/P equals one, the process proceeds to step 160, where the next given count value N is set to be N+1. Having done this, the process continues at step 164.

The preceding discussion has presented a method and apparatus for generating a finely adjustable clock. Such a clock may be used in a phase locked loop, which, in turn, may be used in a video graphics circuit. As used in the video graphics circuit, fine adjustments to the clock, and hence to the phase locked loop, allow the display update rate to be changed over time to substantially match an image update rate. By making the changes in fine increments, the change can be done with minimal adverse visual affects.

I claim:

1. A finely adjustable clock circuit comprising:
    a ring oscillator that generates a plurality of oscillations, each of the plurality of oscillations has an approximately equal period and is phase shifted by an approximately equal phase offset;

a plurality of counting circuits, wherein each of the plurality of counting circuits is operably coupled to receive a corresponding one of the plurality of oscillations and to produce, therefrom, a corresponding periodic representation based on a given count value; and a controller operably coupled to the plurality of counting circuits, wherein the controller selects, based on a control signal, one of the corresponding periodic representations to be an output oscillation, and wherein the controller provides the given count value to the plurality of counting circuits.

2. The finely adjustable clock circuit of claim 1 wherein the controller provides a next given count value=N+integer ((J+K)/P), where N is the current given count value, P represents a number of oscillations in the plurality of oscillations, K represents a number of oscillations jumps pier given slip, and J represents the currently selected one of the corresponding periodic representations.

3. The finely adjustable clock circuit of claim 1 further comprises a reset circuit that resets the plurality of counting circuits such that a known one of the plurality of counting circuits has a phase offset of zero and remaining ones of the plurality of counting circuits maintain a respective phase offset.

4. The finely adjustable clock circuit of claim 1 further comprises, within each of the plurality of counting circuits, a register that stores the given count value, a counter, and a comparator that compares the given count value with an output of the counter.

5. The finely adjustable clock circuit of claim 4 further comprises, within each of the plurality of counting circuits, a flip-flop clocked from the corresponding one of the plurality of oscillations and having the output of the comparator as an input and wherein an output of the flip-flop provides the corresponding periodic representation.

6. The finely adjustable clock circuit of claim 4 further comprises the counter of the counting circuit, which receives the corresponding one of the plurality of oscillations, counting cycles of the corresponding one of the plurality of oscillations up to the given count value to produce the corresponding periodic representation.

7. The finely adjustable clock circuit of claim 1 further comprises the controller including an input to receive the control signal based on a difference between a refresh rate of a display and an image update rate.

8. The finely adjustable clock circuit of claim 1 wherein the controller includes a plurality of switches, logic circuitry, and a buffer inter-operably coupled to select, based on the control signal, the one of the corresponding periodic representations as the output oscillation.

9. A method for generating a finely adjustable clock signal, the method comprising the steps of:
a) generating a plurality of oscillations, each of the plurality of oscillations having an approximately equal period and being phase shifted by an approximately equal phase offset;
b) producing corresponding periodic representations for each of the plurality of oscillations based on a given count value; and
c) selecting one of the corresponding periodic representations as an output oscillation based on a control signal, wherein the control signal represents a difference between a refresh update rate and an image update rate.

10. The method of claim 9 further comprises, within step (b), generating a next given count value=N+integer((J+K/P), where N is the current given count value, P represents a number of oscillations in the plurality of oscillations, K represents a number of oscillations jumps per given slip, and J represents the currently selected one of the corresponding periodic representations.

11. The method of claim 9 further comprises resetting the plurality of oscillations to select one of the plurality of oscillations to have a phase offset of zero.

12. The method of claim 9 further comprises edge shaping the corresponding periodic representations.

13. The method of claim 9 further comprises producing the corresponding periodic representations based on counting cycles of a respective one of the plurality of oscillations up to the given count value.

14. A method for generating a finely adjustable clock signal, the method comprising the steps of:
a) generating a plurality of oscillations, each of the plurality of oscillations has an approximately equal period and is phase shifted by an approximately equal phase offset;
b) counting cycles of each of the plurality of oscillations to produce counted cycles;
c) comparing the counted cycles with a given count value; and
d) when the counted cycles match the given count value, generating a corresponding periodic representation for each of the plurality of oscillation, and
e) selecting one of the corresponding periodic representations as an output oscillation.

15. The method of claim 14 further comprises, within step (c), generating a next given count value=N+integer((J+K/P), where N is the current given count value, P represents a number of oscillations in the plurality of oscillations, K represents a number of oscillations jumps per given slip, and J represents the currently selected one of the corresponding periodic representations.

16. The method of claim 14 further comprises resetting the plurality of oscillations to select one of the plurality of oscillations to have a phase offset of zero.

17. The method of claim 14 further comprises edge shaping the corresponding periodic representations.

18. A phase locked loop circuit comprising:
an input divider operably coupled to receive an input frequency and to produce, therefrom, a divided representation;
a phase detection circuit operably coupled to receive the divided representation and a feedback representation;
a controlled oscillation circuit operably coupled to receive an output of the phase detection circuit and to produce, therefrom, a plurality of oscillations, of which, one is selected as an output oscillation; and
a feedback divider operably coupled to receive the output oscillation and to produce, therefrom, the feedback representation, the feedback divider includes:
a plurality of counting circuits, wherein each of the plurality of counting circuits are operably coupled to receive a corresponding one of the plurality of oscillations and to produce, therefrom, a corresponding periodic representation based on a given value; and
a controller operably coupled to the plurality of counting circuits, wherein the controller selects, based on a control signal, one of the corresponding periodic representations as the feedback representation and wherein the controller provides the given value to the plurality of counting circuits.

19. The finely adjustable clock circuit of claim 1 wherein the controller selects a next one of the corresponding periodic representations=(J+K) modulus (P), where P represents a number of oscillations in the plurality of oscillations, K represents a number of oscillations jumps per given slip, and J represents the currently selected one of the corresponding periodic representations.

20. The method of claim 9 further comprises, within step (c), selecting a next corresponding periodic representations= (J+K) modulus (P), where P represents a number of oscillations in the plurality of oscillations, K represents a number of oscillations jumps per given slip, and J represents the currently selected one of the corresponding periodic representations.

* * * * *